United States Patent [19]

Price, Jr.

[11] Patent Number: 4,739,192

[45] Date of Patent: Apr. 19, 1988

[54] FAST SETTLING DIGITAL TO ANALOG CONVERTER BIT SWITCH

[75] Inventor: John J. Price, Jr., Mesa, Ariz.

[73] Assignee: Motorola, Inc., Schaumburg, Ill.

[21] Appl. No.: 18,316

[22] Filed: Feb. 24, 1987

[51] Int. Cl.⁴ .............................................. H03K 5/153
[52] U.S. Cl. .................................... 307/362; 307/491; 307/494
[58] Field of Search ................ 307/360, 362, 491, 494

[56] References Cited

U.S. PATENT DOCUMENTS

| | | | |
|---|---|---|---|
| 3,961,326 | 6/1976 | Craven | 340/347 DA |
| 4,295,063 | 10/1981 | Price, Jr. | 307/362 |
| 4,383,248 | 5/1983 | Smith | 340/347 DA |

Primary Examiner—John Zazworsky
Attorney, Agent, or Firm—William E. Koch

[57] ABSTRACT

A bit switch is provided for use in a digital-to-analog converter for providing a bit current to a summing bus. A first differential pair of switching devices are responsive to a digital input signal and provide first and second output signals to a second differential pair of switching devices that provide the bit current. First and second drive circuits are coupled between the first and second differential pair of switching devices for respectively slowing down the voltage transition of the first and second output signals for reducing glitches in the bit current.

5 Claims, 1 Drawing Sheet

FAST SETTLING DIGITAL TO ANALOG CONVERTER BIT SWITCH

FIELD OF THE INVENTION

This invention relates in general to digital-to-analog converters, and more particularly to an integrated bit current switch circuit having reduced settling time and an improved temperature response.

BACKGROUND OF THE INVENTION

Digital-to-analog converters typically have a plurality of differential transistor pairs functioning as switches. Digital input signals representative of a binary number determine the on-off state of each switch wherein the on state of each switch supplies a binary scaled bit current to a summing bus to form an analog signal corresponding to the digital input signal.

One such type of switch, the Craven cell, is described in U.S. Pat. No. 3,961,326. The Craven cell comprises a first differential transistor pair which are biased by an input signal and a reference voltage, and a second differential pair which switch the bit current between the output bus and ground. However, in the Craven cell, a rapid change in the input level is coupled through the base-collector capacitance of the input transistor of the first differential pair and affects the voltage at the base of one of the transistors in the second differential pair. Thus, the voltages at the bases of the second differential pair are not precisely differential voltages. This causes a glitch at the emitters of the second differential pair which, especially in the case of low bit currents, may take a considerable amount of time to settle out.

Another known switch that substantially eliminates the glitches inherent in the Craven cell is described in U.S. Pat. No. 4,295,063, wherein a first differential transistor pair is biased by a digital input signal and a reference voltage, a second differential transistor pair directs a bit current onto a summing bus, and a third differential transistor pair has an input coupled to the first pair and an output coupled to the second pair for reducing any overshoot in the magnitude of the output caused by fast transitions of the input signal.

Another known switch, wherein the output may be latched, comprises a first differential transistor pair biased by a digital input signal and a reference voltage, a second differential transistor pair that are cross-coupled and are responsive to the output of the first pair, a third differential transistor pair responsive to the output of the first and second pair for directing an output current onto a summing bus, and a fourth differential transistor pair responsive to toggle and latch signals for enabling either the first or second pair. However, parasitic feedback caused by the junction capacitance in the third and fourth pair due to the fast transitions of the digital input signal and toggle and latch signals creates an overshooting or glitches in the output signal on the summing bus.

Yet another known switch, U.S. Pat. No. 4,383,248, having a reduced overshoot, comprises a capacitor coupled across the output of a data input differential pair of transistors and a cross coupled differential pair of transistors. A digital-to-analog differential pair of transistors is responsive to the output of the data input differential pair of transistors and the cross coupled differential pair of transistors. However, this circuit includes an area consuming capacitor.

Thus, what is needed is a digital-to-analog converter bit current switch circuit having reduced settling time and an improved temperature response without requiring a space consuming capacitor.

SUMMARY OF THE INVENTION

Accordingly, it is an object of the present invention to provide an improved bit switch for a digital-to-analog converter.

A further object of the present invention is to provide a bit switch for a digital-to-analog converter having an output having reduced settling time.

Still another object of the present invention is to provide a bit switch for a digital-to-analog converter having an improved temperature response.

In carrying out the above and other objects of the invention in one form, there is provided a bit switch for use in a digital-to-analog converter for providing a bit current to a summing bus. A first differential pair of switching devices are responsive to a digital input signal and provide first and second output signals to a second differential pair of switching devices that provide the bit current. First and second drive circuits are coupled between the first and second differential pair of switching devices for respectively slowing down the voltage transition of the first and second output signals for reducing glitches in the bit current.

The above and other objects, features, and advantages of the present invention will be better understood from the following detailed description taken in conjunction with the accompanying drawings.

DETAILED DESCRIPTION OF THE INVENTION

Figure 1A:
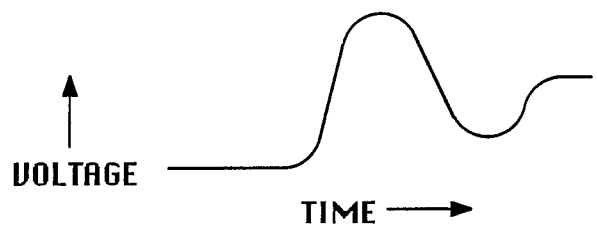
FIG. 1a and 1b are waveform plots illustrating output signals.
Figure 1B:
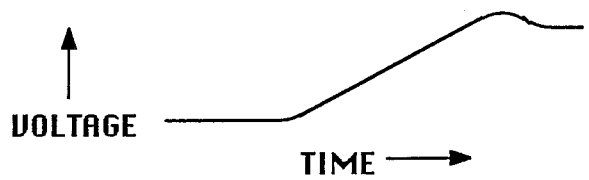

A digital-to-analog converter typically comprises a plurality of bit switches, each switch receiving a digital input signal wherein the signals are representative of a binary number. The output of each bit switch is summed to give an analog signal. Generally, it is desired to have a high speed digital-to-analog converter. To accomplish this, the bit switches are typically driven with a fast transitioning voltage input signal. However, a fast transition causes the output signal to overshoot the final output voltage. This is illustrated in FIG. 1a wherein the output signal is plotted with voltage versus time. If the transition of the output voltage may be slowed down, then the overshoot can be minimized and the settling time can be greatly reduced, as illustrated in FIG. 1b.

Figure 2:
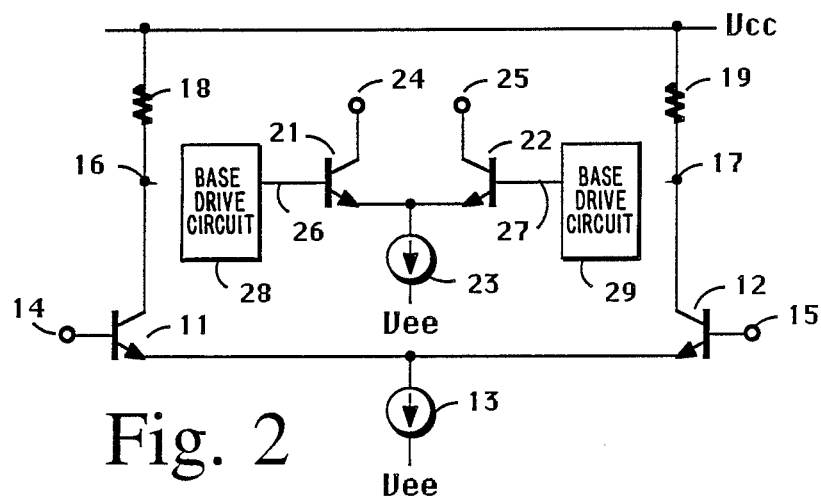
FIG. 2 is a partial block diagram of the present invention.

This advantage is accomplished by the digital-to-analog bit switch illustrated in FIG. 2. Differentially connected transistors 11 and 12 have their emitters coupled to supply voltage $V_{EE}$ by current source 13, their bases connected to input terminals 14 and 15 for receiving a first and a second input signal, respectively, and collectors coupled to nodes 16 and 17, respectively. Nodes 16 and 17 are coupled to supply voltage $V_{CC}$ by resistors 18 and 19, respectively. Differentially connected transistors 21 and 22 have their emitters coupled to supply voltage $V_{EE}$ by current source 23, their collectors coupled to output terminals 24 and 25 for providing a first and a second output signal, and their bases connected to nodes 26 and 27, respectively. Base drive circuit 28 is coupled between nodes 16 and 26 and base drive circuit 29 is coupled between nodes 17 and 27. Base drive circuits 28 and 29 may be similar and are illustrated in schematic form in FIG. 3. The first and second input signals applied to terminals 14 and 15 determine the voltage at nodes 16 and 17. The voltage at nodes 16 and 17 is transferred through base drive circuits 28 and 29 to nodes 26 and 27 wherein the transition is slowed in a manner to be described in greater detail hereinafter. The resulting output at terminals 24 and 25 is then summed with the output of other bit switches in a manner previously described.

Figure 3:
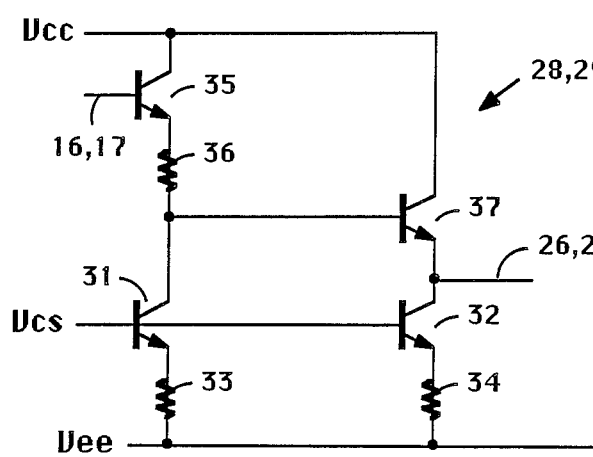
FIG. 3 is a schematic of a base drive circuit of FIG. 2.

Referring to FIG. 3, base drive circuit 28 and 29 comprise current source transistors 31 and 32 having their emitters coupled to supply voltage $V_{EE}$ by resistors 33 and 34, respectively, and their bases coupled to current source voltage $V_{CS}$. Transistor 35 has a collector coupled to supply voltage $V_{CC}$, a base coupled to one of nodes 16, 17, and an emitter coupled by resistor 36 to both the collector of transistor 31 and the base of transistor 37. Transistor 37 has its collector coupled to supply voltage $V_{CC}$ and its emitter connected both to node 26, 27 and to the collector of transistors 32. As the voltage at node 16, 17 rises, transistor 35 becomes more conductive, causing transistor 37 to become more conductive, thereby providing a higher voltage at nodes 26, 27. A time delay provided by the resistance and parasitic capacitance of resistor 36 slows the voltage transition from a low voltage to a high voltage. The voltage at node 26, 27 is set by setting the resistive value of resistor 36 and the current produced by transistor 31 and resistor 33. In this manner, the collector current of transistor 31 is made proportional to the absolute temperature. This current produces a positive temperature coefficient in the voltage across resistor 36, which helps compensate for the negative temperature coefficient of transistors 35 and 37. The result is a more constant voltage with respect to temperature at nodes 26 or 27 (in the DC state), providing a more constant compliance voltage at the DAC output.

By now it should be apreciated that there has been provided an integrated bit current switch circuit having reduced settling time and an improved temperature response.

I claim:

1. A bit switch for use in a digital-to-analog converter for providing a bit current to a summing bus, comprising:

first and second differentially connected transistors having their emitters coupled to a first voltage terminal, said first transistor having a base coupled to receive a digital input signal and a collector coupled to a first node, said first node coupled to a second voltage terminal by a first resistor, said second transistor having a base coupled to one of a reference voltage or another input signal and a collector coupled to a second node, said second node coupled to said second voltage terminal by a second resistor;

first means coupled to said first node for slowing down the voltage translation of said bit current;

second means coupled to said collector of said second transistor for slowing down the voltage translation of said bit current; and a differential pair of switching devices coupled to said first and second means for providing said bit current.

2. The bit switch according to claim 1 wherein said differential pair of switching devices comprises third and fourth transistors having their emitters coupled to said first voltage terminal, said third transistor having a base coupled to said first means and a collector coupled to a first output terminal, said fourth transistor having a base coupled to said second means and a collector coupled to a second output terminal.

3. The bit switch according to claim 2 wherein said first and second means comprise:
 a first current source;
 a second current source;
 a third resistor;
 a fifth transistor having a collector coupled to said second voltage terminal, a base coupled to the collector of the respective of said first or second transistors, and an emitter coupled to said first current source by said third resistor; and
 a sixth transistor having a collector coupled to said second voltage terminal, a base coupled to a node between said third resistor and said first current source, and an emitter coupled both to said second current source and to the base of the respective of said third or fourth transistors.

4. The bit switch according to claim 2 wherein said first and second means comprise:
 a first current source;
 a second current source;
 a third resistor;
 a fifth transistor having a collector coupled to a second voltage terminal, a base coupled to said first differential pair of switching devices, and an emitter coupled to a node, said node coupled to said first voltage terminal by said first current source; and
 a sixth transistor having a collector coupled to said second voltage terminal, a base coupled to said node, and an emitter coupled both to said first voltage terminal by said second current source and to said second differential pair of switching devices.

5. A bit switch for use in a digital-to-analog converter for providing a bit current to a summing bus, comprising:
 a first voltage terminal;
 a second voltage terminal;
 a first current source;
 a second current source;
 a third current source;
 a fourth current source;
 a first resistor;
 a second resistor;
 a third resistor;
 a fourth resistor;
 a first input terminal;
 a second input terminal;
 a first output terminal;
 a second output terminal;
 a first transistor having a base coupled to said first input terminal, an emitter coupled to said first voltage terminal by said first current source, and a collector coupled to a first node, said first node coupled to said second voltage terminal by said first resistor;

a second transistor having a base coupled to said second input terminal, an emitter coupled to said first voltage terminal by said first current source, and a collector coupled to a second node, said second node coupled to said second voltage terminal by said second resistor;

a third transistor having a collector coupled to said first output terminal, an emitter coupled to said first voltage terminal by said second current source, and a base;

a fourth transistor having a collector coupled to said second output terminal, an emitter coupled to said first voltage terminal by said second current source, and a base;

a fifth transistor having a collector coupled to said second voltage terminal, a base coupled to said first node, and an emitter coupled to a third node by said third resistor, said third node coupled to said first voltage terminal by said third current source;

a sixth transistor having a collector coupled to said second voltage terminal, a base coupled to said third node, and an emitter coupled both to said first voltage terminal by said fourth current source and to said base of said third transistor;

a seventh transistor having a collector coupled to said second voltage terminal, a base coupled to said second node, and an emitter coupled to a fourth node by said fourth resistor, said fourth node coupled to said first voltage terminal by said fourth current source; and an eighth transistor having a collector coupled to said second voltage terminal, a base coupled to said fourth node, and an emitter coupled both to said first voltage terminal by said fourth current source and to said base of said fourth transistor.

* * * * *